(12) United States Patent
Woo

(10) Patent No.: US 10,593,580 B2
(45) Date of Patent: Mar. 17, 2020

(54) EFEM, EQUIPMENT FRONT END MODULE

(71) Applicant: Bum Je Woo, Seongnam (KR)

(72) Inventor: Bum Je Woo, Seongnam (KR)

( * ) Notice: Subject to any disclaimer, the term of this patent is extended or adjusted under 35 U.S.C. 154(b) by 74 days.

(21) Appl. No.: 15/934,819

(22) Filed: Mar. 23, 2018

(65) Prior Publication Data

US 2019/0287834 A1    Sep. 19, 2019

(30) Foreign Application Priority Data

Mar. 14, 2018   (KR) .......................... 10-2018-0029495

(51) Int. Cl.
*H01L 21/677* (2006.01)
*H01L 21/67* (2006.01)

(52) U.S. Cl.
CPC .. *H01L 21/67745* (2013.01); *H01L 21/67017* (2013.01); *H01L 21/67196* (2013.01); *H01L 21/67766* (2013.01)

(58) Field of Classification Search
CPC .................. H01L 21/67766; H01L 21/67745
See application file for complete search history.

(56) References Cited

U.S. PATENT DOCUMENTS

| 4,851,018 | A | * | 7/1989 | Lazzari | F24F 3/161 |
| | | | | | 55/356 |
| 7,018,517 | B2 | * | 3/2006 | Kurita | C23C 14/566 |
| | | | | | 118/719 |
| 9,010,384 | B2 | * | 4/2015 | Yoshimura | H01L 21/67772 |
| | | | | | 141/63 |
| 9,818,658 | B2 | * | 11/2017 | Wilby | H01L 21/67103 |
| 2016/0136818 | A1 | * | 5/2016 | Kitahara | B65G 47/90 |
| | | | | | 414/222.07 |
| 2018/0122676 | A1 | * | 5/2018 | Kong | H01L 21/67772 |
| 2018/0174875 | A1 | * | 6/2018 | Kim | H01L 21/67017 |

FOREIGN PATENT DOCUMENTS

| KR | 100524204 B1 | 1/2006 |
| KR | 20070082056 A | 8/2007 |
| KR | 20100007216 A | 1/2010 |
| KR | 20100022060 A | 2/2010 |
| KR | 101002949 B1 | 12/2010 |
| KR | 1020150009421 A | 1/2015 |
| KR | 20150065449 A | 6/2015 |
| KR | 101768596 B1 | 8/2017 |

* cited by examiner

*Primary Examiner* — Jonathan Snelting

(57) ABSTRACT

The present invention relates to an equipment front end module (EFEM) configured to perform wafer transfer between process equipment and a wafer storage device that stores wafers. More particularly, the present invention relates to an equipment front end module (EFEM), which enables gases supplied into the wafer transfer chamber to efficiently flow to maintain cleanness in the wafer transfer chamber at a high level, thus preventing contamination in the wafer transfer chamber.

8 Claims, 11 Drawing Sheets

210

EFEM, EQUIPMENT FRONT END MODULE

CROSS REFERENCE TO RELATED APPLICATION

The present application claims priority to Korean Patent Application No. 10-2018-0029495, filed Mar. 14, 2018, the entire contents of which is incorporated herein for all purposes by this reference.

BACKGROUND OF THE INVENTION

Field of the Invention

The present invention relates to an equipment front end module (EFEM) configured to perform wafer transfer between process equipment and a wafer storage device that stores wafers.

Description of the Related Art

As well known in the art, wafers are processed in a clean room in a semiconductor manufacturing process in order to improve yield and quality. However, as devices have become more highly integrated, circuits have become finer, and wafers have become larger, maintaining cleanness in the entire clean room has become difficult from both a technical and cost point of view.

Therefore, in recent years, the cleanliness only in a local space around wafers has been managed. For this purpose, a module called equipment front end module (EFEM) has been used for storing wafers in a sealed storage pod called a front-opening unified pod (FOUP), and performing wafer transfer between the FOUP and process equipment that processes the wafers.

Such an EFEM is configured such that a wafer transfer chamber provided with a wafer transfer device is provided, and a load port to which the FOUP is coupled is connected to a first surface of the wafer transfer chamber, and the process equipment is connected to a second surface of the wafer transfer chamber. Accordingly, the wafer transfer device transfers wafers stored in the FOUP to the process equipment and transfers the wafers having been processed in the process equipment into the wafer storage device.

It is noted that Korean Patent No. 10-1002949 (hereinafter referred to as Patent Document 1) and Korean Patent Application Publication No. 10-2015-0009421 (hereinafter referred to as Patent Document 2) disclose regarding this EFEM.

EFEMs disclosed in Patent Documents 1 and 2 are configured such that when wafers stored in a FOUP coupled to a load port are transferred by a robot arm in a wafer transfer chamber, gases are supplied into the wafer transfer chamber, whereby cleanliness in the wafer transfer chamber is managed.

However, in the case of Patent Documents 1 and 2, the wafer transfer chamber in which wafer transfer is performed is shaped in a simple box type, causing deterioration in the cleanliness in the wafer transfer chamber, corrosion in the wafer transfer chamber, etc.

In detail, harmful fumes remain on the wafers taken out from the FOUP, which is exhausted together with the gases supplied into the wafer transfer chamber and thus removed.

However, as described above, in the case of the box type-wafer transfer chamber, the fumes may remain in the corners of the wafer transfer chamber, or may not be efficiently exhausted, thus remaining at the bottom of the wafer transfer chamber.

As such, if the fumes remain in the wafer transfer chamber, the interior of the wafer transfer chamber may be contaminated, causing wafer contamination, and further, causing damage such as corrosion to the wafer transfer chamber, etc.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-1002949
(Patent document 2) Korean Patent Application Publication No. 10-2015-0009421

SUMMARY OF THE INVENTION

Accordingly, the present invention has been made keeping in mind the above problems occurring in the related art, and the present invention provides an EFEM being capable of enabling gases supplied to a wafer transfer chamber to efficiently flow to maintain cleanliness in the wafer transfer chamber, thus preventing contamination in the wafer transfer chamber.

In order to achieve the above object, according to one aspect of the present invention, there is provided an equipment front end module (EFEM), the EFEM including: a wafer transfer chamber in which wafer transfer is performed between a wafer storage device and process equipment; and a delivery unit delivering gases into the wafer transfer chamber, wherein curved surface portions having a streamlined shape are provided on at least a part of an inner surface of the wafer transfer chamber.

Further, the curved surface portions may be formed convexly toward an outside of the wafer transfer chamber.

Further, the curved surface portion may be configured such that convexly curved surface portions formed convexly toward the outside of the wafer transfer chamber and concavely curved surface portions formed concavely toward the outside of the wafer transfer chamber are arranged continuously.

Further, the curved surface portions may be detachable from the inner surface of the wafer transfer chamber.

Further, a heat insulating material may be provided between each of the curved surface portions and the inner surface of the wafer transfer chamber.

Further, a heater heating the wafer transfer chamber may be provided on the inner surface of the wafer transfer chamber.

Further, the curved surface portions may be made of a polymer material.

Further, an opening to which the wafer storage device or the process equipment is connected may be formed on the inner surface of the wafer transfer chamber, and the opening is provided with opening-curved surface portions radially arranged based on a center of the opening and formed convexly toward the outside of the wafer transfer chamber.

Further, one of the curved surface portions provided on a corner of the inner surface of the wafer transfer chamber may be formed convexly outward from the corner of the wafer transfer chamber.

The EFEM may further includes: an exhaust unit exhausting the gases in the wafer transfer chamber and including an exhaust plate provided with a plurality of exhaust holes; and an airflow guide portion provided on the inner surface of the wafer transfer chamber, wherein the airflow guide portion is positioned at a position corresponding to a position between each of the plurality of exhaust holes and an adjacent exhaust hole such that the gases delivered from the delivery unit flow to respective adjacent exhaust holes of the plurality of exhaust holes.

According to the EFEM of the present invention as described above, the following effects can be obtained.

The gases delivered from the delivery unit flow along the curved surface portions, whereby down flow in the wafer transfer chamber can efficiently flow to the exhaust holes and be exhausted. Thus, it is possible to prevent the fumes from remaining in the wafer transfer chamber, thereby effectively preventing equipment in the wafer transfer chamber from being contaminated and damaged.

The inner surface of the wafer transfer chamber has a curved shape, whereby it is possible to effectively prevent a vortex from being generated when the gases delivered from the delivery unit are exhausted to the exhaust unit. Thus, the down flow foiled when the gases delivered from the delivery unit flows from the delivery unit to the exhaust unit can be a laminar flow rather than turbulent flow, whereby delivery and exhaust of the gases in the wafer transfer chamber can be efficiently maintained.

By using the curved surface portions made of a polymer material or coating the curved surface portions, it is possible to effectively prevent damage (or corrosion) of the curved surface portions themselves.

The curved surface portions are detachable from the inner surface of the wafer transfer chamber, thereby achieving easy replacement of the curved surface portions.

The detachable curved surface portions are provided with skirts, whereby joints between the curved surface portions and the inner surface of the wafer transfer chamber can be effectively sealed.

By provision of the front wall opening-curved surface portions and rear wall opening-curved surface portions, it is possible to enable gases to efficiently flow to the wafer transfer chamber, the process equipment, and the wafer storage device.

By provision of the heater and the heat insulating material, it is possible to prevent polymer particles present in the fumes from solidifying. Thus, the fumes in the wafer transfer chamber can be effectively exhausted and cleanliness in the wafer transfer chamber can be maintained at a high level.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
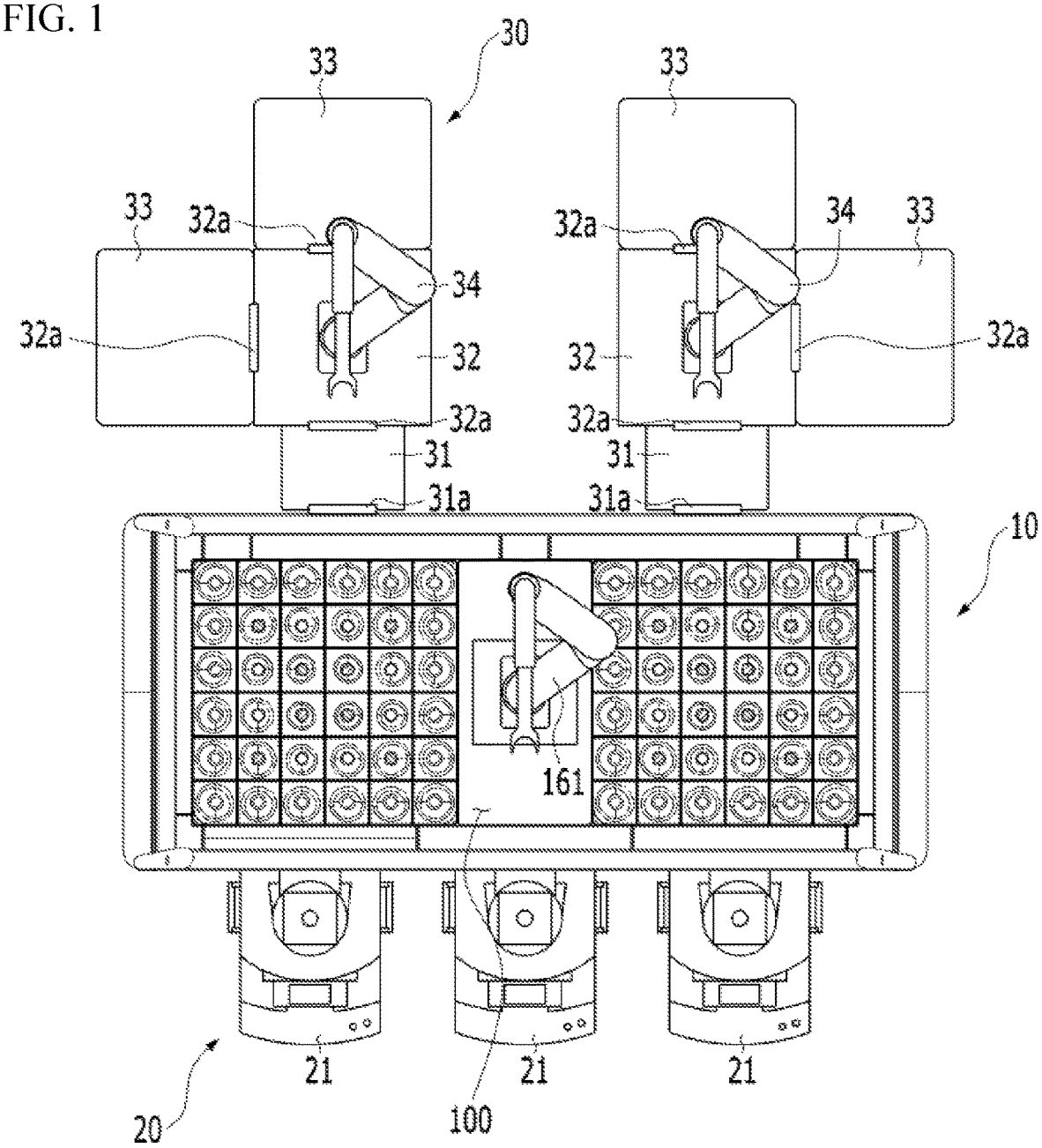
FIG. 1 is a plan view showing a process chamber connected to an EFEM according to a preferred embodiment of the present invention.

Hereinbelow, preferred embodiments of the present invention will be described in detail with reference to the accompanying drawings. Throughout the drawings, the same reference numerals will refer to the same or like parts.

Figure 2:
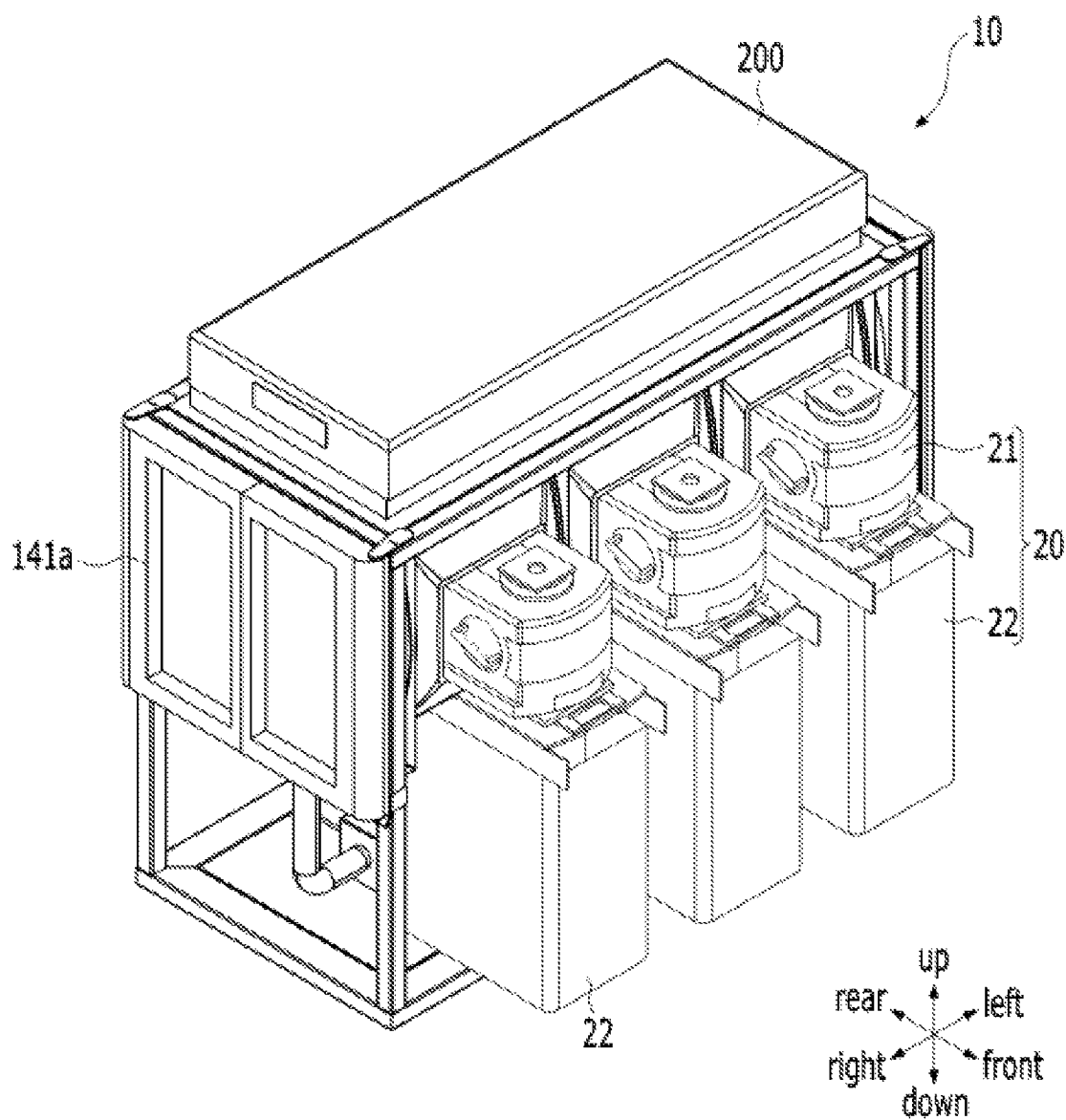
FIG. 2 is a perspective view showing load ports connected to the EFEM according to the preferred embodiment of the present invention.
Figure 3:
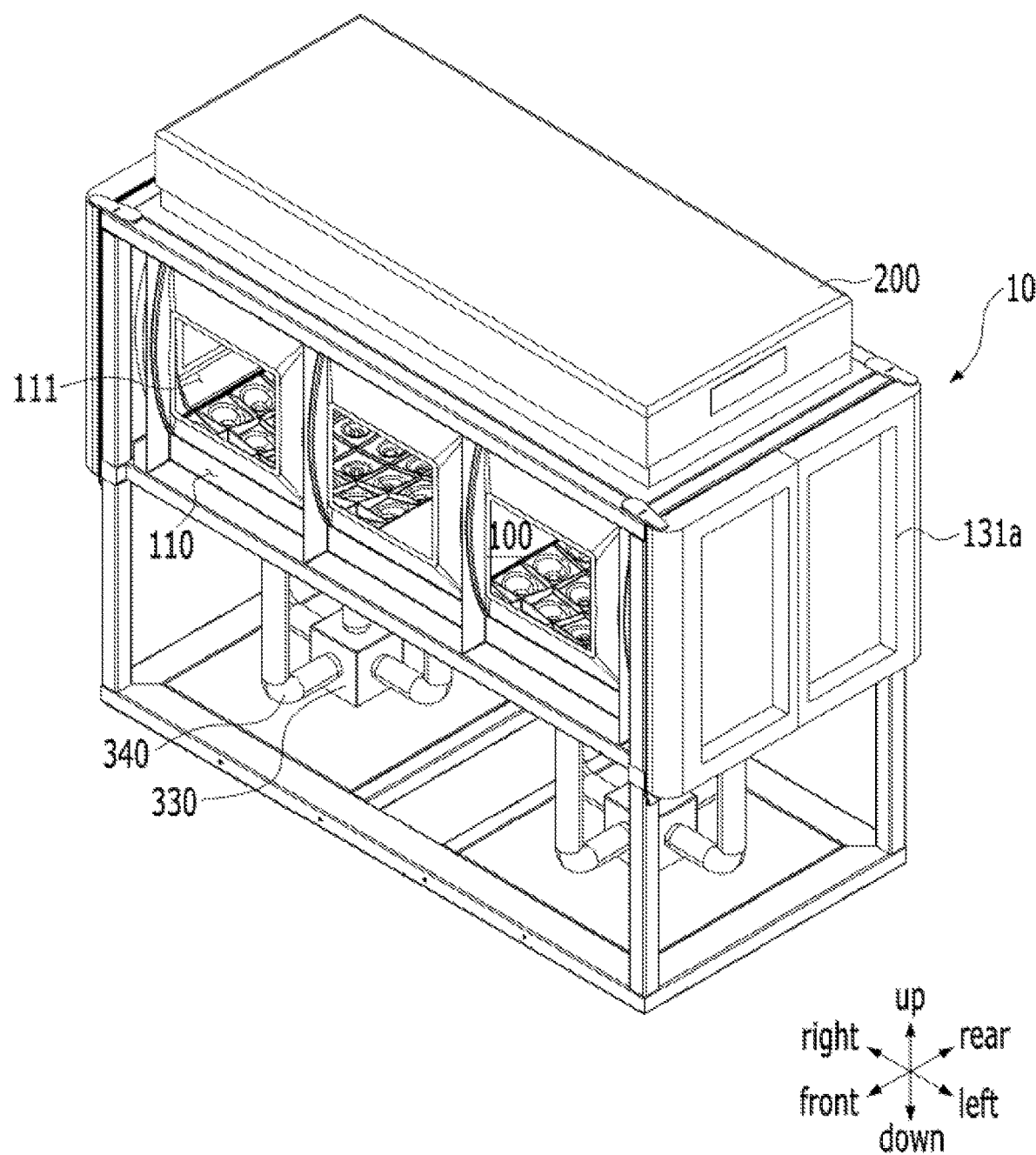
FIGS. 3 and 4 are perspective views showing the EFEM according to the preferred embodiment of the present invention.
Figure 4:
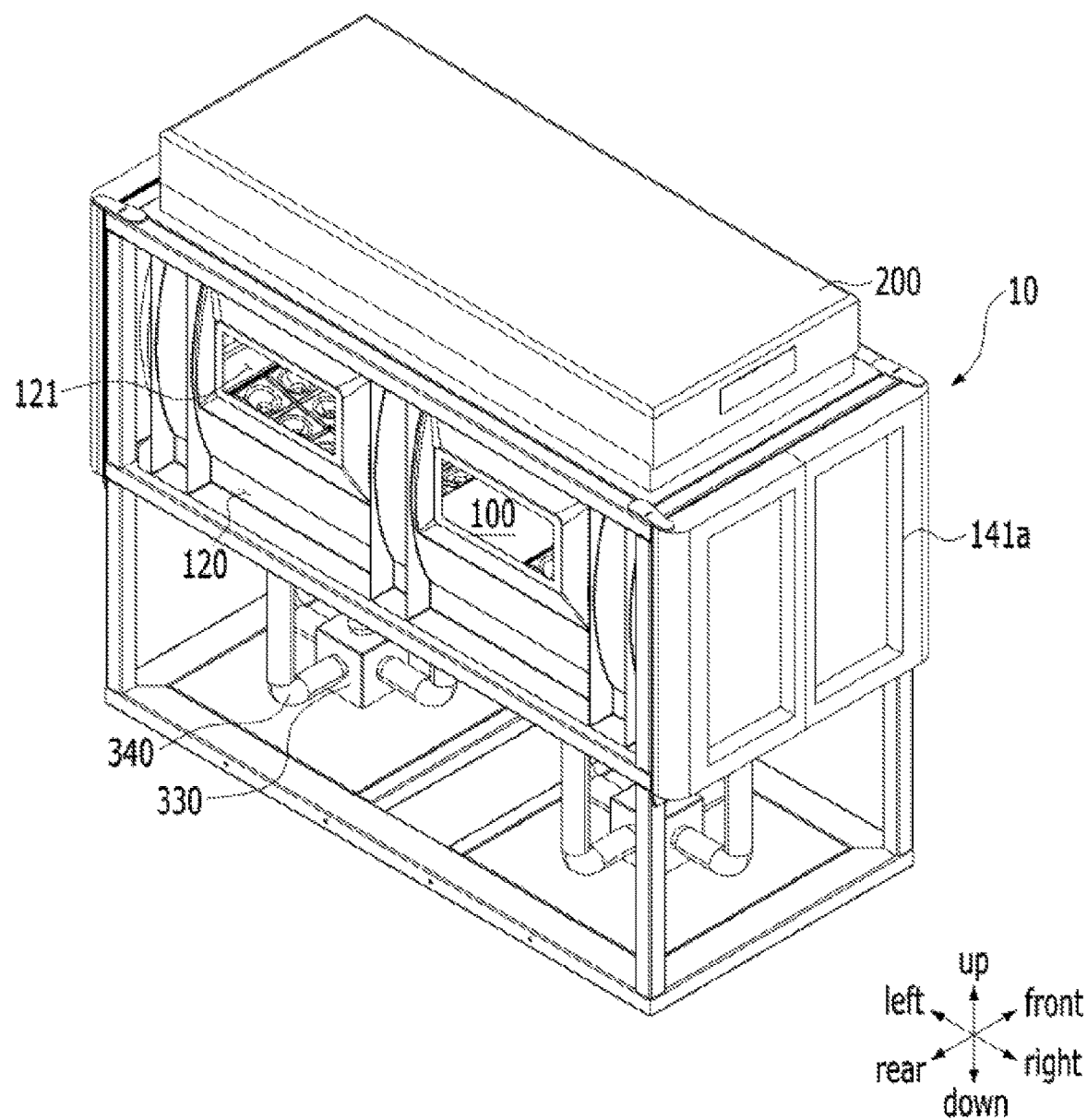
Figure 5:
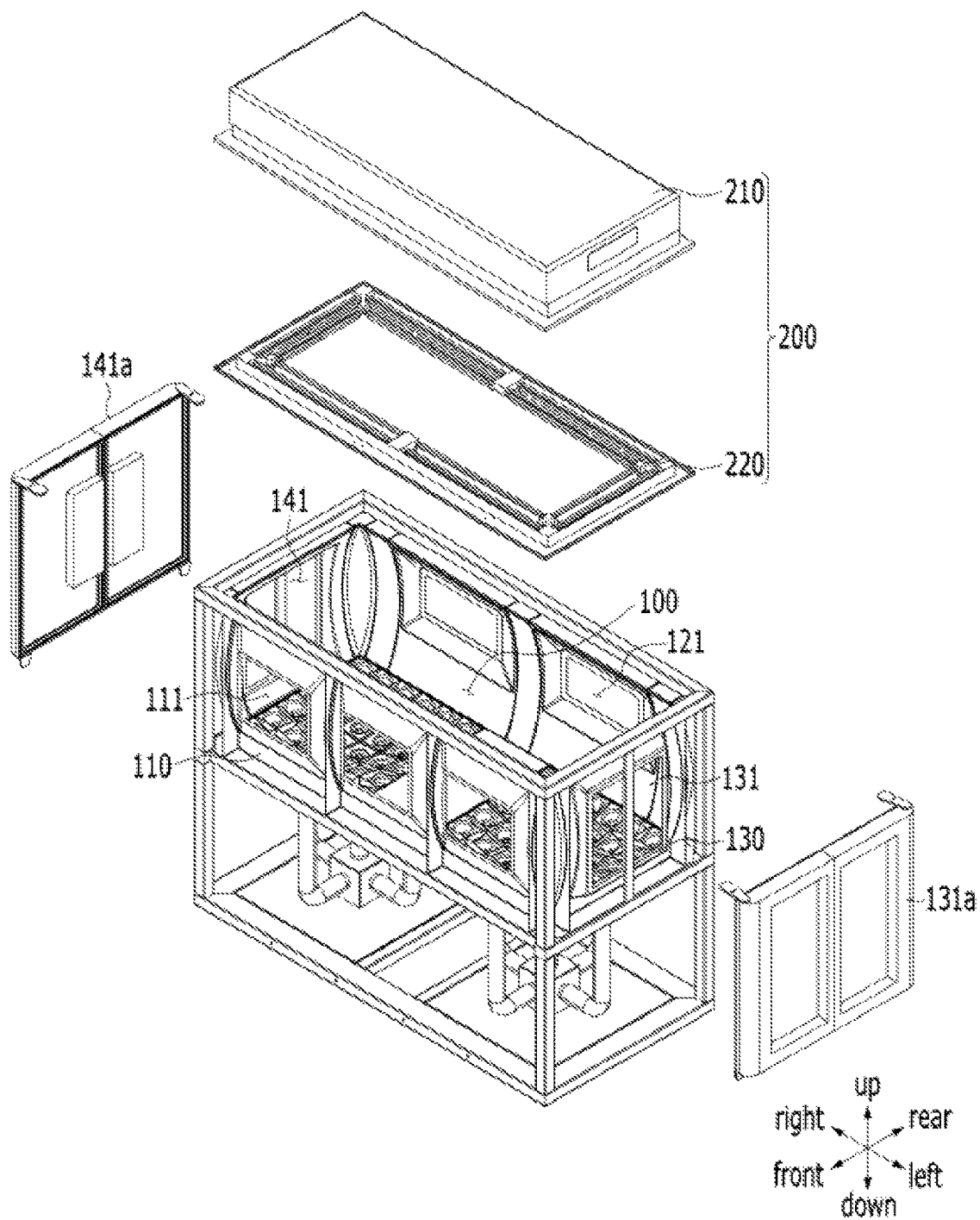
FIG. 5 is an exploded view of FIG. 3.
Figure 6:
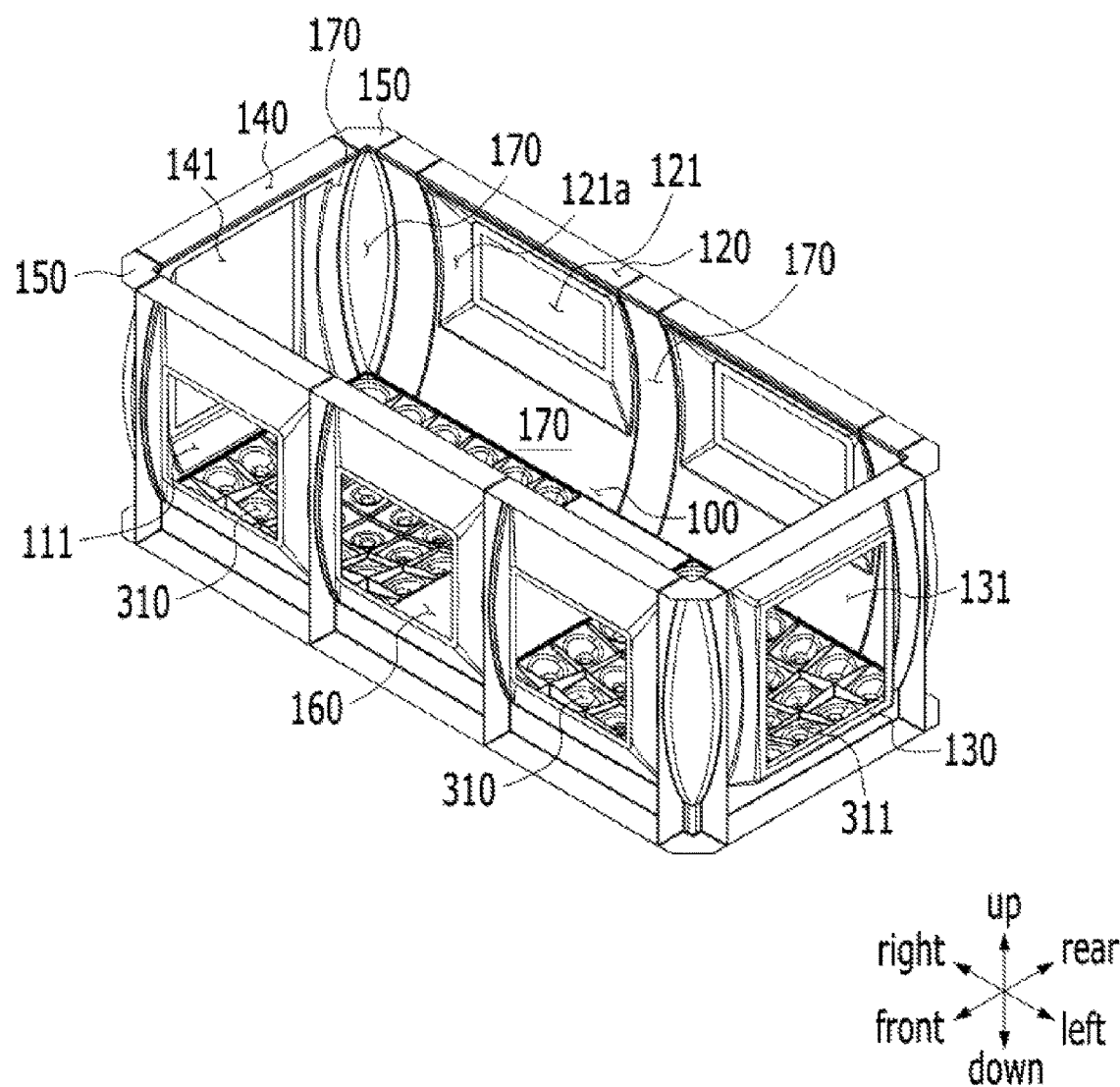
FIG. 6 is a perspective view showing a wafer transfer chamber of FIG. 3.
Figure 7:
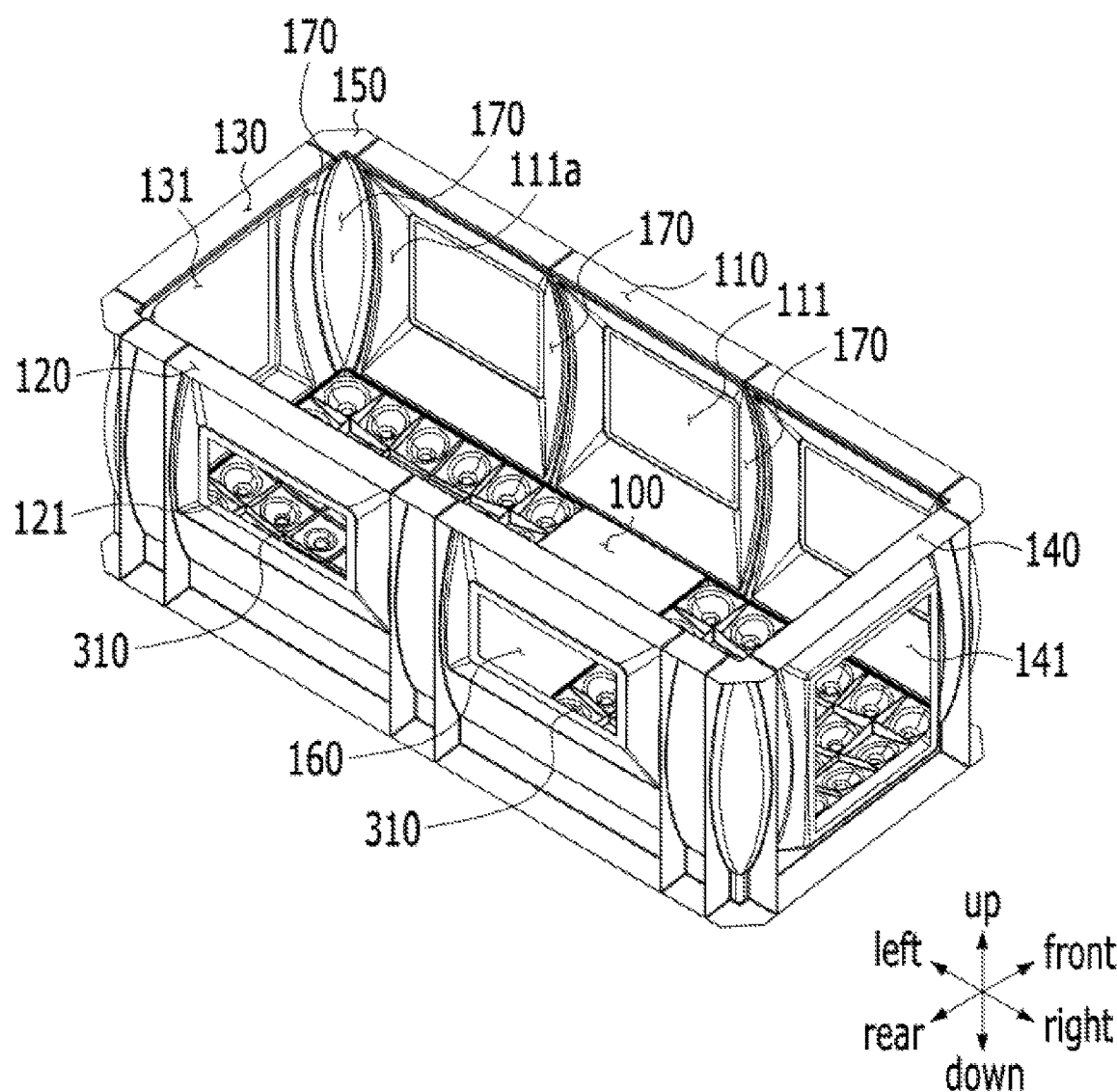
FIG. 7 is a perspective view showing the wafer transfer chamber of FIG. 4.
Figure 8:
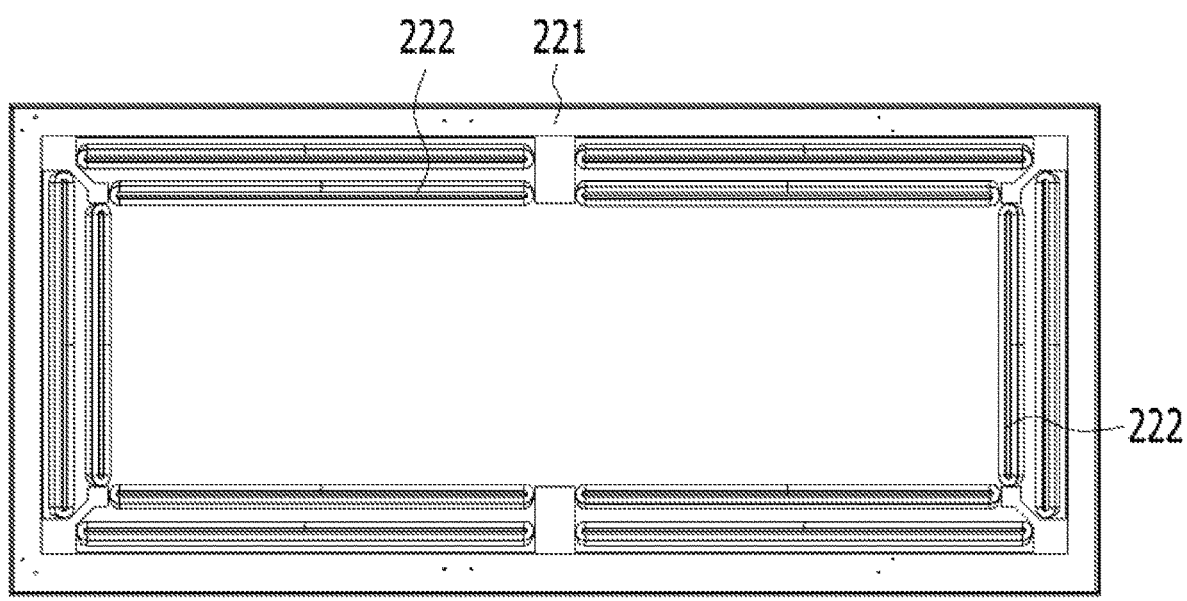
FIG. 8 is a plan view showing an airflow control unit of a delivery unit of FIG. 3.
Figure 9:
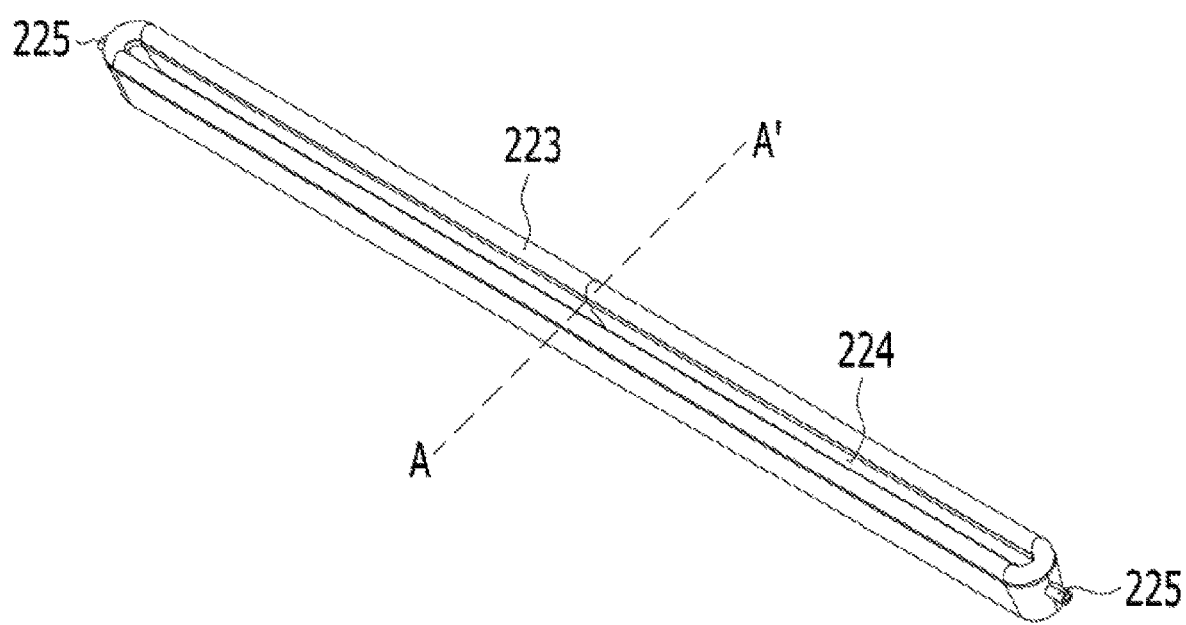
FIG. 9 is a perspective view showing an airflow control blade of the airflow control unit of FIG. 8.
Figure 10:
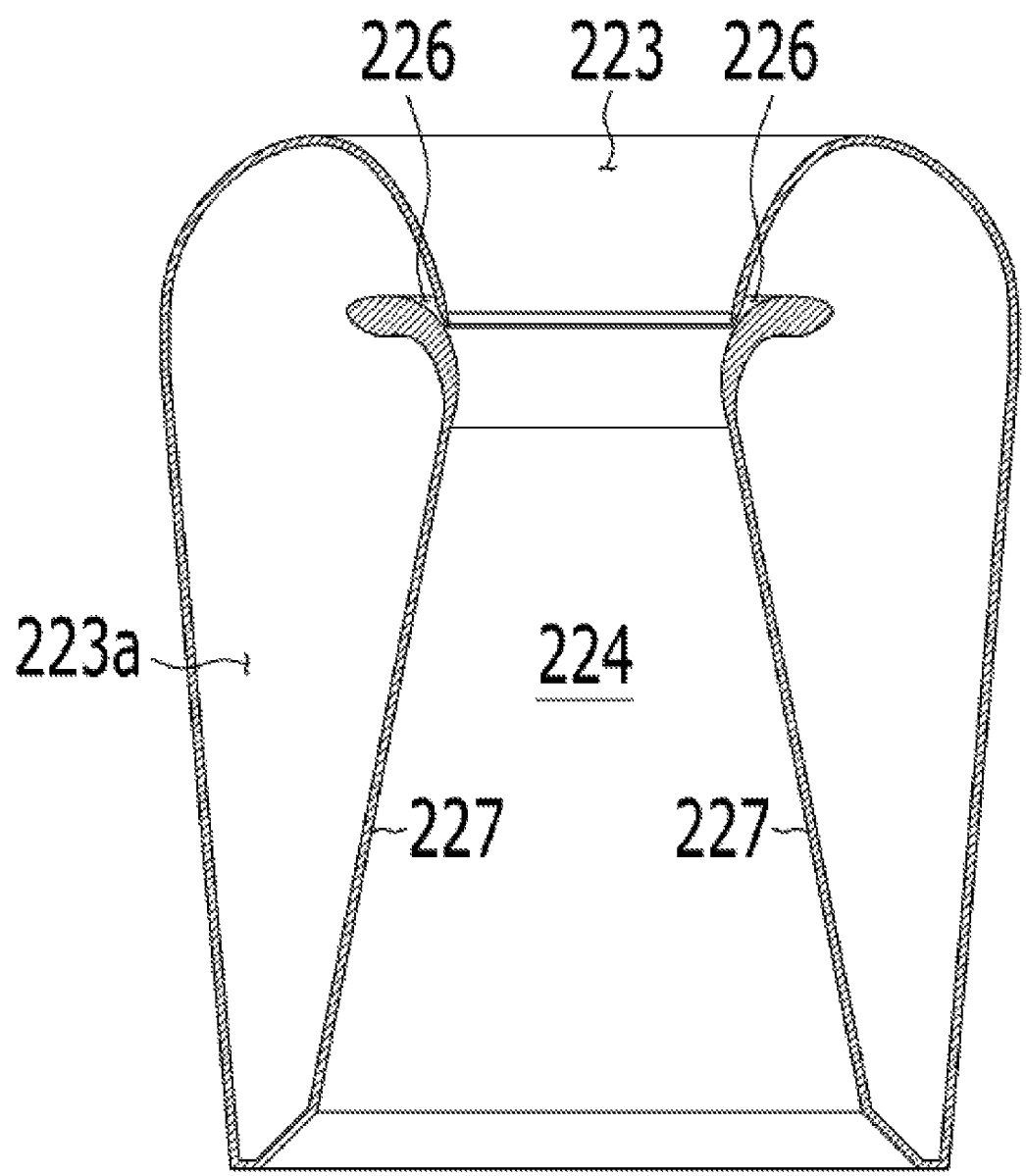
FIG. 10 is a cross sectional view taken along line A-A' of FIG. 9.
Figure 11:
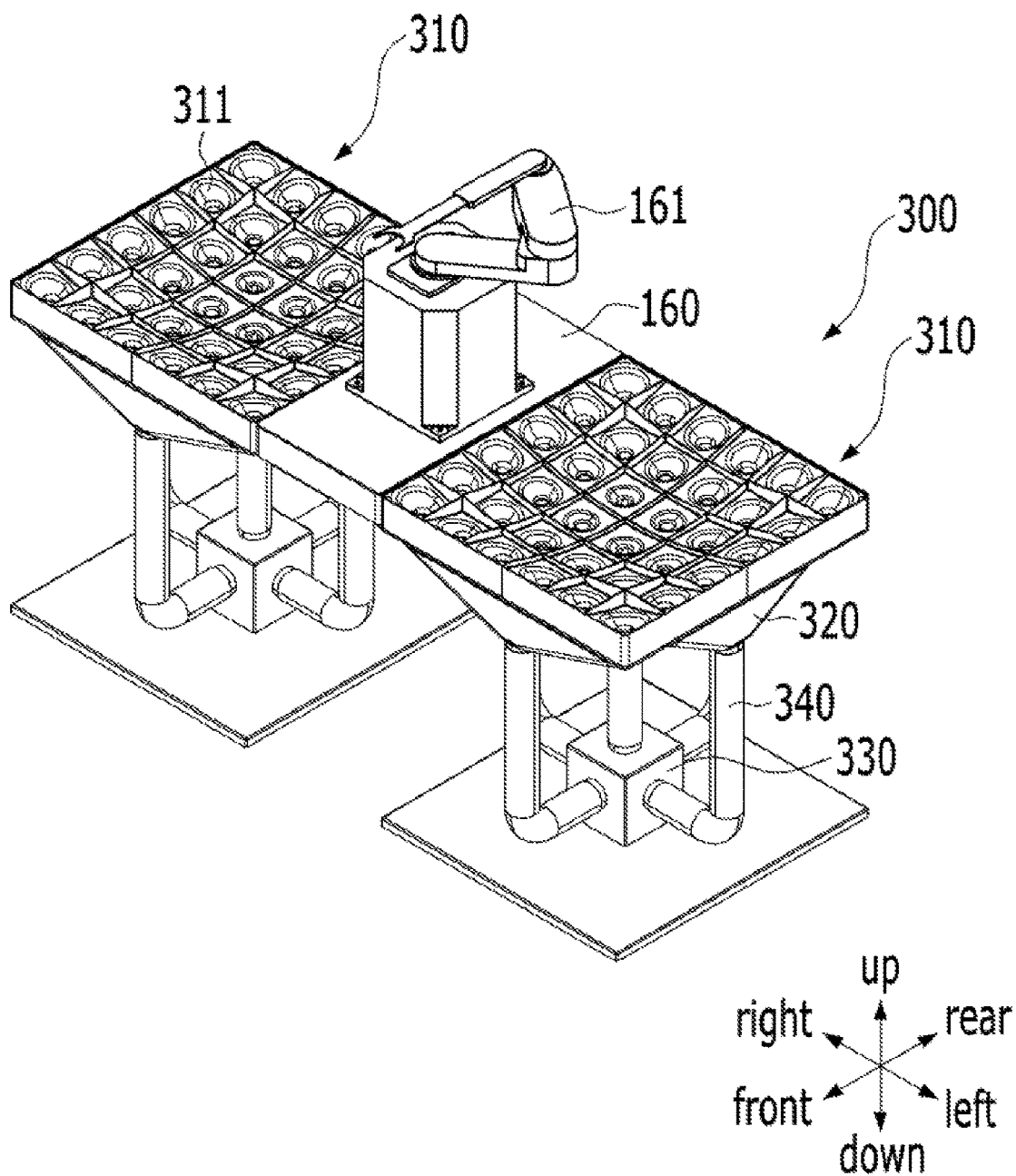
FIG. 11 is a perspective view showing an exhaust unit of FIG. 3.

FIG. 1 is a plan view showing a process chamber connected to an EFEM according to a preferred embodiment of the present invention, FIG. 2 is a perspective view showing load ports connected to the EFEM according to the preferred embodiment of the present invention, FIGS. 3 and 4 are perspective views showing the EFEM according to the preferred embodiment of the present invention, FIG. 5 is an exploded view of FIG. 3, FIG. 6 is a perspective view showing a wafer transfer chamber of FIG. 3, FIG. 7 is a perspective view showing the wafer transfer chamber of FIG. 4, FIG. 8 is a plan view showing an airflow control unit of a delivery unit of FIG. 3, FIG. 9 is a perspective view showing an airflow control blade of the airflow control unit of FIG. 8, FIG. 10 is a cross sectional view taken along line A-A' of FIG. 9, and FIG. 11 is a perspective view showing an exhaust unit of FIG. 3.

Hereinafter, an EFEM 10 according to a preferred embodiment of the present invention will be described.

As shown in FIGS. 1 to 5, the EFEM 10 according to the preferred embodiment of the present invention includes a wafer transfer chamber 100 in which wafer transfer is performed between a wafer storage device 20 and process equipment 30, a delivery unit 200 for delivering gases into the wafer transfer chamber 100, and an exhaust unit 300 for exhausting the gases in the wafer transfer chamber 100.

The gases in the EFEM 10 denotes to all gases in the EFEM 10 including inert gas that will be described later. The inert gas denotes gas such as nitrogen, argon, etc.

A plurality of wafer storage devices 20 is arranged in connection to a front surface of the EFEM 10.

Each of the wafer storage devices 20 includes a FOUP 21 for storing wafers and a load port 22 on which the FOUP 21 is coupled and loaded.

The FOUP 21 is open at a side thereof, and a plurality of wafers is received through the open side and stored in a vertical arrangement in the FOUP 21. Accordingly, when the wafers are transported during each process in a wafer manufacturing process, the wafers can be easily transported through the FOUP 21.

The FOUP 21 is coupled and loaded on the load port 22. Accordingly, when the load port 22 is installed on the front surface of the EFEM 10, the open side of the FOUP 21 communicates with a front wall opening 111 formed in a front wall 110 of the wafer transfer chamber 100, whereby the FOUP 21 and the wafer transfer chamber 100 are connected and communicate with each other.

When the FOUP 21 and the load port 22 are coupled to each other, gases are supplied into the FOUP 21 through a gas delivery unit of the load port 22, whereby cleanliness of the wafers stored in the FOUP 21 can be managed separately.

The process equipment 30 is connected to a rear surface of the EFEM 10. In this case, a load lock chamber 31 of the process equipment 30 communicates with a rear wall opening 120 formed in a rear wall 120 of the wafer transfer chamber 100, whereby the process equipment 30 is connected to the rear surface of the EFEM 10.

A plurality of process equipment 30 may be connected to the rear surface of the EFEM 10, and the process equipment 30 may have various configurations.

For example, the process equipment 30 is configured such that a process equipment transfer chamber 32 is installed adjacent to the load lock chamber 31, and a plurality of process units 33 processing wafers is installed adjacent to the process equipment transfer chamber.

A load lock chamber door 31a may be provided between the load lock chamber 31 and the rear wall 120 of the wafer transfer chamber 100. By opening and closing operation of the load lock chamber door 31a, the wafer transfer chamber 100 and the load lock chamber 31 can communicate with or can block each other.

A process equipment transfer chamber door 32a may be installed between the process equipment transfer chamber 32 and each of the process units 33. By opening operation of the process equipment transfer chamber doors 32a, the process equipment transfer chamber 32 and the plurality of process units 33 can communicate with or can block each other.

The process equipment transfer chamber 32 may be provided with a process equipment transfer device 34, such that wafer transfer can be performed between the load lock chamber 31 and the plurality of process units 33 by using the process equipment transfer device 34.

Wafer Transfer Chamber 100

Hereinafter, the wafer transfer chamber 100 will be described.

As shown in FIG. 1, the wafer transfer chamber 100 functions to provide a space in which wafer transfer is performed between the wafer storage devices 20 connected to the front surface of the EFEM 10 and the process equipment 30 connected to the rear surface of the EFEM 10.

Such wafer transfer is performed by a transfer device 161 installed in the wafer transfer chamber 100.

As shown in FIGS. 3 to 7, the gas deliver unit 200 is positioned on an upper portion of the wafer transfer chamber 100.

An exhaust plate 310 of the exhaust unit 300 and an installation plate 160 on which the transfer device 161 is installed are positioned on a lower portion of the wafer transfer chamber 100, that is, the bottom of the wafer transfer chamber 100. Accordingly, a bottom surface of the wafer transfer chamber 100 is formed by the exhaust plate 310 and the installation plate 160.

The wafer transfer chamber 100 is provided with a plurality of walls forming a circumferential surface of the wafer transfer chamber 100. An opening is provided in one of the walls to which the wafer storage devices 20, the process equipment 30, or a fume removal device is connected.

Hereinafter, a case where the plurality of walls forming the circumferential surface of the wafer transfer chamber 100 includes the front wall 110, the rear wall 120, a left wall 130, a right wall 140, and corner walls 150 will be representatively described.

Furthermore, a case where the opening includes the front wall opening 111 formed in the front wall 110, the rear wall opening 121 formed in the rear wall 120, a left wall opening 131 formed in the left wall 130, and a right wall opening 141 formed in the right wall 140 will be representatively described.

The inner surface of the wafer transfer chamber 100, which will be described later, denotes to a surface facing the interior of the wafer transfer chamber 100 and includes inner side walls of the front wall 110, the rear wall 120, the left wall 130, the right wall 140, and the corner walls 150, a ceiling surface on which the delivery unit 200 is positioned and forming a ceiling of the wafer transfer chamber 100, and the bottom surface on which the exhaust unit 300 is positioned and forming the bottom of the wafer transfer chamber 100.

Accordingly, the front wall opening 111, the rear wall opening 121, the left wall opening 131, and the right wall opening 141 described above are formed through the inner side surfaces of the front wall 110, the rear wall 120, the left wall 130, and the right wall 140.

The front wall 110 is provided at a front surface of the wafer transfer chamber 100, the rear wall 120 is provided at a rear surface of the wafer transfer chamber 100, and the left and right walls 130 and 140 are respectively provided at left and right surfaces of the wafer transfer chamber 100.

Furthermore, each of the corner walls 150 is provided at a corner of the wafer transfer chamber 100, that is, at a position between the front and left walls 110 and 130, a position between the front and right walls 110 and 140, a position between the rear and left walls 120 and 130, and a position between the rear and right walls 120 and 140.

The wafer transfer chamber 100 is configured such that the circumferential surface thereof is formed by the front wall 110, the rear wall 120, the left wall 130, the right wall 140, and the corner walls 150, which are described above, and the bottom surface thereof is formed by the exhaust plate 310.

The front wall 110 is provided with the front wall opening 111 connected with the FOUP 21 of the wafer storage device 20, and the rear wall 120 is provided with the rear wall opening 121 connected with the load lock chamber 31 of the process equipment 30.

Furthermore, the left wall 130 and the right wall 140 are provided with the left wall opening 131 and the right wall opening 141, respectively.

At least one of the wafer storage device 20, the process equipment 30, and a separate fume removal device for removing fumes on wafers may be connected to the left wall opening 131 or the right wall opening 141.

In addition, a left wall door 131a and a right wall door 141a may be respectively installed on the left wall 130 and the right wall 140 to open and close the left wall opening 131 and the right wall opening 141. In this case, a pair of left wall doors 131a and a pair of right wall doors 141a may be provided, such that both doors of the left wall doors 131a and both doors of the right wall doors 141a are opened and closed to open and close the left wall doors 131a and the right wall doors 141a.

As described above, the wafer transfer chamber 100 is provided with the front wall 110, the rear wall 120, the left wall 130, the right wall 140, and the corner walls 150, thereby having a structure in which the circumferential surface thereof is substantially closed.

Furthermore, the inner side surfaces (i.e., inside surfaces) of the front wall 110, the rear wall 120, the left wall 130, the right wall 140, and the corner walls 150 of the wafer transfer chamber 100 forms the inner surface of the wafer transfer chamber 100, and curved surface portions 170 having a streamlined shape are provided on at least a part of the inner surface of the wafer transfer chamber 100.

The curved surface portions 170 function to control flow of gases when the gases delivered from the delivery unit 200 are exhausted through the exhaust unit 300.

As shown in FIGS. 5 to 7, the curved surface portions 170 may be formed convexly toward the outside of the wafer transfer chamber 100.

Furthermore, one of the curved surface portions 170 provided on a corner of the inner surface of the wafer transfer chamber 100, that is, one of the curved surface portions 170 provided on each of the inside surfaces of the corner walls 150, may be formed convexly outward from the corner of the wafer transfer chamber 100.

As such, the curved surface portions 170 are formed convexly toward the outside of the wafer transfer chamber 100 or are formed convexly outward from the corners of the wafer transfer chamber 100, whereby unlike an EFEM in the related art, the inner surface of the wafer transfer chamber 100 has a streamlined curved shape. Thus, when gases are delivered from the delivery unit 200, the gases flows through the curved surface portions 170 formed on the inner surface of the wafer transfer chamber 100, whereby the gases can be efficiently exhausted together with the fumes from the inside of the wafer transfer chamber 100 to the exhaust unit 300.

Furthermore, unlike the EFEM in the related art, the inner surface of the wafer transfer chamber 100 has a curved shape rather than a straight shape, so that the fumes do not remain in the wafer transfer chamber 100. Accordingly, it is possible to prevent wafer contamination caused by residual fumes and prevent the inner surface of the wafer transfer chamber 100 and equipment in the wafer transfer chamber 100 such as the transfer device 161 from being contaminated and damaged.

In addition, the inner surface of the wafer transfer chamber 100 has a curved shape, whereby it is possible to effectively prevent a vortex from being generated when gases delivered from the delivery unit 200 are exhausted to the exhaust unit 300. Accordingly, down flow formed when the gases delivered from the delivery unit 200 flow from the delivery unit 200 to the exhaust unit 300 can be a laminar flow rather than turbulent flow, whereby delivery and exhaust of the gases in the wafer transfer chamber 100 can be efficiently maintained.

The curved surface portions 170 may be made of a polymer material. The curved surface portions 170 made of the polymer material are excellent in chemical resistance and corrosion resistance, so that damage (or corrosion) due to the fumes can be effectively prevented. Furthermore, the curved surface portions 170 may be coated with a material having excellent chemical resistance and corrosion resistance, whereby damage (or corrosion) of the curved surface portions 170 can be effectively prevented.

The curved surface portions 170 may be configured to be detachable from the inner surface of the wafer transfer chamber 100, that is, the inside surface of the front wall 110, the inside surface of the rear wall 120, the inside surface of the left wall 130, and the inside surfaces of the corner walls 150.

As such, the curved surface portions 170 are detachable from the inner surface of the wafer transfer chamber 100, whereby when the curved surface portions 170 are contaminated or damaged, replacement thereof can be easily performed and thus lifespan of the EFEM 10 can be extended.

A skirt may be provided on at least one of each of the detachable curved surface portions 170 and the inner surface of the wafer transfer chamber 100 to which the curved surface portions 170 are attached, that is, the inside surface of the front wall 110, the inside surface of the rear wall 120, the inside surface of the left wall 130, the inside surface of the right wall 140, and the inside surfaces of the corner walls 150.

The skirt functions to cover and seal a joint between the curved surface portion 170 and the inner surface of the wafer transfer chamber 100, thereby preventing contaminants such as fumes, etc. from flowing into the joint. The skirt may be made of a soft material having elasticity such as rubber having chemical resistance and corrosion resistance, thereby achieving a lifespan extension of the curved surface portions 170.

Of the openings formed in the inner surface of the wafer transfer chamber 100, an opening to which the wafer storage device 20, the process equipment 30, or the fume removal device is connected may be provided with opening-curved surface portions arranged radially based on a center of the opening and formed convexly toward the outside of the wafer transfer chamber 100.

In the present invention, the FOUP 21 of the wafer storage device 20 is connected to the front wall opening 111 and the load lock chamber 31 of the process equipment 30 is connected to the rear wall opening 121, so that the front wall opening 111 may be provided with front wall opening-curved surface portions 111*a* and the rear wall opening 121 may be provided with rear wall opening-curved surface portions 121*a*.

The front wall opening-curved surface portions 111*a* are radially provided on edges of the front wall opening 111 based on a center of the front wall opening 111 and are formed convexly toward the outside of the wafer transfer chamber 100, that is, in the front direction.

The front wall opening-curved surface portions 111*a* allow gases delivered from the delivery unit 200 to efficiently flow into the FOUP 21, or allow gases and fumes in the FOUP 21 to efficiently flow into the wafer transfer chamber 100 and thus be exhausted through the exhaust unit 300.

The rear wall opening-curved surface portions 121*a* are radially provided on edges of the rear wall opening 121 based on a center of the rear wall opening 121 and are formed convexly toward the outside of the wafer transfer chamber 100, that is, in the rear direction.

The rear wall opening-curved surface portions 121*a* allow gases delivered from the delivery unit 200 to flow efficiently into the load lock chamber 31, etc. of the process equipment 30, or allow gases and fumes in the load lock chamber 31, etc. of the process equipment 30 to efficiently flow into the wafer transfer chamber 100 and thus be exhausted through the exhaust unit 300.

A heater for heating the wafer transfer chamber 100 may be provided on the inner surface of the wafer transfer chamber 100, that is, the inside surface of the front wall 110, the inside surface of the rear wall 120, the inside surface of the left wall 130, the inside surface of the right wall 140, and the inside surfaces of the corner walls 150.

Furthermore, a heat insulating material may be provided between each of the curved surface portions 170 and the inner surface of the wafer transfer chamber 100, that is, the inside surface of the front wall 110, the inside surface of the rear wall 120, the inside surface of the left wall 130, the inside surface of the right wall 140, and the inside surfaces of the corner walls 150.

As such, by provision of the heater and the heat insulating material, the internal temperature of the wafer transfer chamber 100 can be maintained at a high level, leading to an increase in fume removal efficiency.

Furthermore, polymer particles present in the fumes can be prevented from solidifying, so that the polymer particles can be prevented from adhering to the curved surface portions 170, etc., whereby cleanliness in the wafer transfer chamber 100 can be maintained at a high level.

On the other hand, the curved surface portions 170 provided on the inner surface of the wafer transfer chamber 100 may be configured such that convexly curved surface portions formed convexly toward the outside of the wafer transfer chamber 100 and concavely curved surface portions formed concavely toward the outside of the wafer transfer chamber 100 are arranged continuously.

As such, the convexly curved surface portions and the concavely curved surface portions are arranged continuously, whereby gases discharged from the delivery unit 200 can be efficiently exhausted to exhaust holes 311 of the exhaust unit 300 while flowing along the convexly curved surface portions and the concavely curved surface portions. Thus, it is possible to effectively prevent the fumes from remaining in the wafer transfer chamber 100, and thus prevent equipment in the wafer transfer chamber 100 from being contaminated.

Such sequential arrangement of the convexly curved surface portions and the concavely curved surface portions may vary depending on the size and use of the EFEM 10 and may be configured such that a plurality of convexly curved surface portions and a plurality of concavely curved surface portions are arranged continuously in an alternating manner.

Delivery Unit 200

Hereinafter, the delivery unit 200 will be described with reference to FIGS. 3 to 5 and FIGS. 8 to 10.

As shown in FIGS. 3 to 5, the delivery unit 200 is arranged on the upper portion of the wafer transfer chamber 100 and functions to deliver gases into the wafer transfer chamber 100.

As shown in FIGS. 5 and 8 to 10, the delivery unit 200 includes a fan filter unit (FFU) 210 and an airflow control unit 210 arranged at a lower portion of the fan filter unit 210.

The fan filter unit 210 includes a blower fan and a filter arranged at a lower portion of the blower fan and functions to deliver gases filtered by the filter downward and thus deliver the gases into the wafer transfer chamber 100 to generate down flow.

In other words, the blower fan functions to deliver gases supplied from an external gas supply unit downward to thereby deliver the gases into the wafer transfer chamber 100, so that down flow is generated in the wafer transfer chamber 100 of the EFEM 10.

The filter is positioned at the lower portion of the blower fan and functions to filter foreign substances contained in gases. In this case, a HEPA filter may be used as the filter.

The airflow control unit 220 is arranged at the lower portion of the fan filter unit 210 and functions to control gases delivered by the fan filter unit 210, that is, down flow. The airflow control unit 220 includes a plate 221 arranged at the lower portion of the fan filter unit 210 and a plurality of airflow control blades 222 tiltably installed on the plate 221.

The plurality of airflow control blades 222 are tiltably installed on the plate 221.

In the present invention, for example, as shown in FIG. 8, a total of eight airflow control blades 222 may be installed in pairs, respectively, on front, rear, left, and right sides of the plate 221. In other words, the airflow control blades 222 may be composed of four outer airflow control blades 222 respectively installed on outer front, rear, left, and right sides of the plate 221 and four inner airflow control blades 222 respectively installed on inner front, rear, left, and right sides of the plate 221 so as to be positioned on inner sides of the four outer airflow control blades 222.

As shown in FIGS. 9 and 10, the airflow control blade 222 includes an elongated hole-shaped body 223 having a hole 224 centrally formed therein, compressed gas inlets 225 respectively formed at opposite ends of the body 223 and injecting a compressed gas into the body 223, and compressed gas outlets 226 discharging the compressed gas injected into the body 223 to outside.

The body 223 has an elongated hole shape having the hole 224 centrally formed therein, and as the hole of the body 223 is formed, inclined surfaces 227 are provided on an inside surface of the body 223. In this case, the inclined surfaces 227 are inclined toward the outside of the hole 224 such that the diameter of the hole 224 gradually increases toward a lower portion of the body 223.

The compressed gas inlets 225 are respectively formed at the opposite ends of the body 223 and function to supply an external compressed gas into the body 223.

In this case, the compressed gas may be compressed air or an inert compressed gas obtained by compressing an inert gas such as nitrogen, argon, etc.

The body 223 is provided with retention spaces 223a formed therein, and the retention spaces 223a may be filled with the compressed gas through the compressed gas inlets 225.

The compressed gas outlets 226 are small gaps communicating with the retention spaces 223a, and the compressed gas in the body 223, that is, in the retention spaces 223a, is discharged to outside through the compressed gas outlets 226.

Hereinafter, a method of controlling flow of gases delivered from the fan filter unit 210 through the airflow control blade 222 having the above-described configuration will be described.

First, when the blower fan of the fan filter unit 210 is operated and gases are delivered and then filtered through the filter, the delivered gases flow downward to form a kind of down flow.

A part of such down flow passes through the hole 224 of the body 223 of the airflow control blade 222.

When the compressed gas is injected through the compressed gas inlets 225 into the retention spaces of the body 223, the compressed gas flows out of the body 223 through the compressed gas outlets 226.

The compressed gas having flowed out of the body 223 flows along the inclined surfaces 227 due to the Coanda effect, whereby a region where the compressed gas is discharged through the compressed gas outlets 226 instantaneously reaches a low pressure state. Accordingly, gases passing through the hole 224 rapidly flows into the low-pressure region and are mixed with the compressed gas and then rapidly flows to the lower portion of the body 223.

The gases delivered from the fan filter unit 210 are rapidly discharged (flows out) through the hole 224 of the body 223 together with the compressed gas injected into the airflow control blade 222, and the airflow control blade 222 is tiltable, so that speed and direction of the gases delivered from the fan filter unit 210, that is, the down flow, can be efficiently controlled by adjusting a tilting angle of the airflow control blade 222.

As described above, the delivery unit 200 can deliver gases into the wafer transfer chamber 100 to form down flow and control the speed and direction of the down flow, whereby it is possible to deliver the gases into the wafer transfer chamber 100 without generating a dead region therein.

Exhaust Unit 300

Hereinafter, the exhaust unit 300 will be described with reference to FIGS. 5 to 7 and FIG. 11.

The exhaust unit 300 is positioned on the lower portion of the wafer transfer chamber 100 and functions to exhaust gases in the wafer transfer chamber 100.

The gases exhausted by the exhaust unit 300 includes gases delivered by the delivery unit 200, the compressed gas injected through the compressed gas inlets 225 of the airflow control blade 222, and the fumes remaining on wafers.

As shown in FIG. 11, the exhaust unit 300 includes the exhaust plate 310 forming a part of the bottom surface of the wafer transfer chamber 100 and provided with a plurality of exhaust holes 311, an exhaust duct 320 communicating with the exhaust holes 320, and an exhaust passage 340 allowing the exhaust duct 320 and a collecting box 330 to communicate with each other.

The exhaust plate 310 forms a part of the bottom surface of the wafer transfer chamber 100 and is provided with the plurality of exhaust holes 311.

In other words, the exhaust plate 310 is positioned in an area where the installation plate 160 is not installed in the wafer transfer chamber 100. Thus, the bottom surface of the wafer transfer chamber 100 is formed by the installation plate 160 and the exhaust plate 310.

The exhaust duct 320 is positioned at a lower portion of the exhaust plate 310, and an exhaust duct hole is centrally formed in the exhaust duct 320.

The exhaust duct hole of the exhaust duct 320 communicates with the plurality of exhaust holes 311.

In this case, one exhaust duct hole may communicate with the plurality of exhaust holes 311.

The exhaust duct 320 may be provided in plural, and an exhaust region of the plurality of exhaust holes 311 may be divided into a plurality of exhaust regions by the plurality of exhaust ducts 320.

The exhaust passage 340 may be provided in plural and function to allow the plurality of exhaust ducts 320 to communicate with the collecting box 330.

The collecting box 330 functions to communicate with the plurality of exhaust passages 340 and communicate with an external exhaust unit of the EFEM 10 to thereby finally exhaust gases through the exhaust holes 311 to the external exhaust unit.

The exhaust unit 300 having the above-described configuration exhausts gases in the wafer transfer chamber 100 to the external exhaust unit communicating with the collecting box 330 through the exhaust holes 311 of the exhaust plate 310. Thus, harmful gases such as fumes in the wafer transfer chamber 100 can be efficiently exhausted to the outside of the EFEM 10.

As described above, the exhaust region of the plurality of exhaust holes 311 is divided into the plurality of exhaust regions, so that down flow in the wafer transfer chamber 100 can be efficiently exhausted without generating a dead region therein where the down flow is not exhausted.

In order to achieve more efficient exhaust of gases in the wafer transfer chamber 100, the EFEM 10 may further include an airflow guide portion provided on the inner surface of the wafer transfer chamber 100, that is, the inside surface of the front wall 110, the inside surface of the rear wall 120, the inside surface of the left wall 130, the inside surface of the right wall 140, and the inside surfaces of the corner walls 150.

The airflow guide portion protrudes from the inner surface of the wafer transfer chamber 100 and is provided at a position corresponding to a position between each of the plurality of exhaust holes 311 and an adjacent exhaust hole 311.

As described above, the airflow guide portion is provided at the position corresponding to the position between each of the plurality of exhaust holes 311 and the adjacent exhaust hole 311, so that gases flowing along the airflow guide portions can efficiently flow into respective adjacent exhaust holes 311. Thus, when gases are delivered from the delivery unit 200 in the form of down flow, the gases flow along the curved surface portions 170 and then along the airflow guide portions, thus efficiently flowing to each of the plurality of exhaust holes 311.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An equipment front end module (EFEM), the EFEM comprising:
   a wafer transfer chamber in which wafer transfer is performed between a wafer storage device and process equipment, wherein the wafer transfer chamber includes a front wall, a rear wall, a left wall, a right wall, and corner walls, so as to form an inner surface of the wafer transfer chamber;
   a delivery unit positioned on an upper portion of the wafer transfer chamber for delivering gases into the wafer transfer chamber; and
   an exhaust unit positioned on a lower portion of the wafer transfer chamber for exhausting the gases in the wafer transfer chamber,
   wherein the inner surface of the wafer transfer chamber has curved surface portions,
   wherein each of the corner walls is provided at a corresponding one of a position between the front and left walls, a position between the front and right walls, a position between the rear and left walls, and a position between the rear and right walls, and
   wherein one of the curved surface portions that are provided on the corner walls is formed convexly outward from a corner of the wafer transfer chamber.

2. The EFEM of claim 1, wherein the curved surface portions are formed convexly toward an outside of the wafer transfer chamber.

3. The EFEM of claim 1, wherein the curved surface portions are detachable from the inner surface of the wafer transfer chamber.

4. The EFEM of claim 3, wherein a heat insulating material is provided between each of the curved surface portions and the inner surface of the wafer transfer chamber.

5. The EFEM of claim 1, wherein a heater heating the wafer transfer chamber is provided on the inner surface of the wafer transfer chamber.

6. The EFEM of claim 1, wherein the curved surface portions are made of a polymer material.

7. The EFEM of claim 1, wherein an opening to which the wafer storage device or the process equipment is connected is formed on the inner surface of the wafer transfer chamber, and the opening is provided with opening-curved surface portions radially arranged based on a center of the opening and formed convexly outward from the wafer transfer chamber.

8. The EFEM of claim 1, further comprising:

an airflow guide portion provided on the inner surface of the wafer transfer chamber, wherein the exhaust unit includes an exhaust plate provided with a plurality of exhaust holes, and wherein the airflow guide portion is positioned at a position corresponding to a position between each of the plurality of exhaust holes and an adjacent exhaust hole such that the gases delivered from the delivery unit flow to respective adjacent exhaust holes of the plurality of exhaust holes.

* * * * *